(12) United States Patent
Divakaruni et al.

(10) Patent No.: US 6,426,247 B1
(45) Date of Patent: Jul. 30, 2002

(54) LOW BITLINE CAPACITANCE STRUCTURE AND METHOD OF MAKING SAME

(75) Inventors: Ramachandra Divakaruni, Somers, NY (US); Jeffrey P. Gambino, Westford, VT (US); Jack A. Mandelman, Stormville; Rajesh Rengarajan, Poughkeepsie, both of NY (US)

(73) Assignees: International Business Machines Corporation, Armonk, NY (US); Infineon Technologies North American Corp., San Jose, CA (US)

( * ) Notice: Subject to any disclaimer, the term of this patent is extended or adjusted under 35 U.S.C. 154(b) by 8 days.

(21) Appl. No.: 09/764,824

(22) Filed: Jan. 17, 2001

(51) Int. Cl.[7] ............... H01L 21/338; H01L 21/461; H01L 21/31
(52) U.S. Cl. ............... 438/185; 438/740; 438/761
(58) Field of Search ............... 438/185, 761, 438/740

(56) References Cited

U.S. PATENT DOCUMENTS

| | | | | |
|---|---|---|---|---|
| 5,518,961 A | * | 5/1996 | Ishimaru | 438/586 |
| 6,058,065 A | | 5/2000 | Lattimore et al. | 365/230.03 |
| 6,165,826 A | * | 12/2000 | Chau et al. | 438/226 |
| 6,316,321 B1 | * | 11/2001 | Lin et al. | 438/303 |
| 2001/0010961 A1 | * | 8/2001 | Jung et al. | 438/279 |

* cited by examiner

Primary Examiner—Trung Dang
Assistant Examiner—William M. Brewster
(74) Attorney, Agent, or Firm—Ira Blecker; Cantor Colburn LLP

(57) ABSTRACT

A method for forming a memory device having low bitline capacitance, comprising: providing a gate conductor stack structure on a silicon substrate, said gate stack structure having a gate oxide layer, a polysilicon layer, a silicide layer, and a top dielectric nitride layer; oxidizing sidewalls of said gate oxide stack; forming sidewall spacers on the sidewalls of said gate conductor stack, said sidewall spacers comprising a thin layer of nitride having a thickness ranging from about 50 to about 250 angstroms; overlaying the gate structure with a thin nitride liner having a thickness ranging from about 25 to about 150 angstroms; depositing an insulative oxide layer over the gate structure; polishing the insulative oxide layer down to the level of the nitride liner of the gate structure; patterning and etching the insulative oxide layer to expose said nitride liner; forming second sidewall spacers over said first sidewall spacers, said second sidewall spacers comprising an oxide layer having a thickness ranging from about 100 to about 400 angstroms; and, depositing and planarizing a layer of polysilicon covering said gate structure and the sidewall spacers.

10 Claims, 4 Drawing Sheets

LOW BITLINE CAPACITANCE STRUCTURE AND METHOD OF MAKING SAME

FIELD OF INVENTION

The present invention relates to a method to fabricate high density dynamic random access memories (DRAMs). In specific, it relates to a method to fabricate such DRAMs having reduced bitline capacitance.

BACKGROUND OF THE INVENTION

Both static random access memory (SRAM) and dynamic random access memory (DRAM) have one or more arrays of memory cells organized into rows (wordlines) and columns (bitlines). Each memory cell represents a single bit and is accessed by a unique address defined by the intersection of a row and a column. Reading data from or writing data to memory cells is achieved by activating selected wordlines and bitlines. In DRAMs, each input/output pin is connected to each memory cell via a "sense amplifier", which usually is one or more transistors configured to hold and amplify the charge to be read from or written to the cell. The sensitivity of the sense amplifier is proportional to the ratio of the capacitance of the node to the capacitance of the sensing bitline. Hence, it always is beneficial to have higher node capacitance or lower bitline capacitance (the bitline capacitance includes components of bitline to adjacent bitline, junction capacitance, and bitline to wordline capacitance).

As DRAMs are manufactured with increasing densities, the memory cells necessarily are made smaller and smaller and packed closer and closer together to pack as much memory into as small a space as possible. The increased density drives the bitlines closer together increasing the coupling between adjacent bitlines and also the coupling between bitlines and wordlines. This increased bitline capacitance makes it more difficult to detect the logical "0" or logical "1" in the memory cell.

SUMMARY OF THE INVENTION

Now, according to the present invention, a high density dynamic random access memory having substantially reduced bitline capacitance is provided, and, a method of fabricating such a DRAM device. This novel device is achieved mainly by reducing bitline contact to an active wordline capacitance. The proposed process offers advantages of (a) reduced aspect ratio of bitline etches, (b) reduced bitline to bitline leakage to thereby allow gap fills of lower reflow temperature, (c) reduced array junction leakage by utilizing a self-aligned polysilicon diffused junction for planar array transistors, and (d) improved support device rolloff characteristics due to use of raised source-drain junctions.

DETAILED DESCRIPTION OF THE INVENTION

Figure 1:
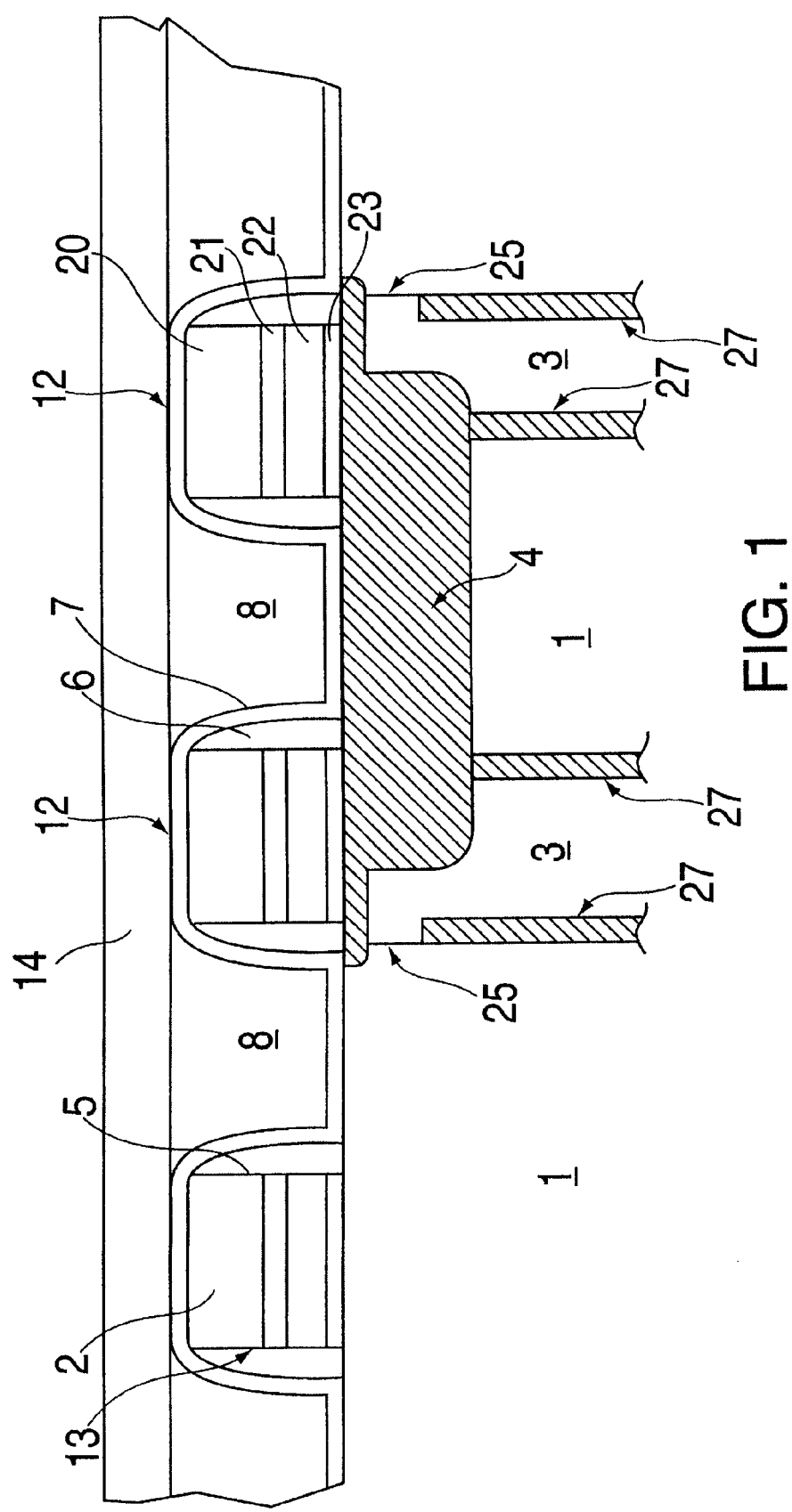
FIGS. 1–3 are cross-sectional views illustrating progressive stages of fabricating one embodiment of a DRAM pursuant to a process according to the present invention.

Referring now to FIG. 1, there is shown a cross-section of a typical silicon semiconductor wafer on substrate 1, having a plurality of CMOS gate structures 2 formed thereon. Such gates 2 generally comprise a gate oxide layer 23, a gate polysilicon layer 22, a silicide layer (e.g., tungsten silicide ($_{W_{Si}X}$)) 21, and a nitride (e.g., silicon nitride) cap 20. The silicon substrate 1 may have numerous substructures therein, such as deep trenches 3, collars 27, and shallow trench isolation (STI) 4, where desired to isolate gate structures 2. Generally, device isolation regions such as STI take the form of thick, non-conductive field oxide regions extending below the surface of the semiconductor substrate. In STI, a sharply defined trench is formed in the semiconductor substrate by techniques such as anisotropic etching. The trench is filled with oxide back to the surface of the substrate to provide a device isolation region. For example, the STI 4, as shown, isolates adjacent buried straps 25, and also isolates passing wordlines 12 from the underlying trenches 3.

After defining the boundaries of the gates by a photoresist mask and etching by standard etch techniques such as reactive ion etching (RIE), the sidewalls 5 are then oxidized 13 and protective sidewall spacers 6 are formed, typically made of silicon nitride, using standard techniques. These spacers 6 generally will be from about 50 to about 250 angstroms (preferably about 75 to about 150 angstroms) at their thickest point. This is thinner than common prior art thicknesses of about 300 angstroms, and results in lowered series resistance for PFET devices in the support regions. The gate structure including spacer 6 is overlaid with a thin etch-stop silicon nitride liner 7, generally having a thickness from about 25 to about 150 angstroms (preferably from about 50 to about 100 angstroms). After deposition of liner 7, a first interlevel insulative oxide layer 8, such as boron phosphorus silicate glass (BPSG), is laid down covering all the devices and polished down to the gates 2 to form BPSG areas 8. A second, thin BPSG, or other suitable insulative layer, is then optionally deposited over the planarized surface. The thickness of this second BPSG layer preferably ranges between about 100 angstroms and 1000 angstroms.

Figure 2:
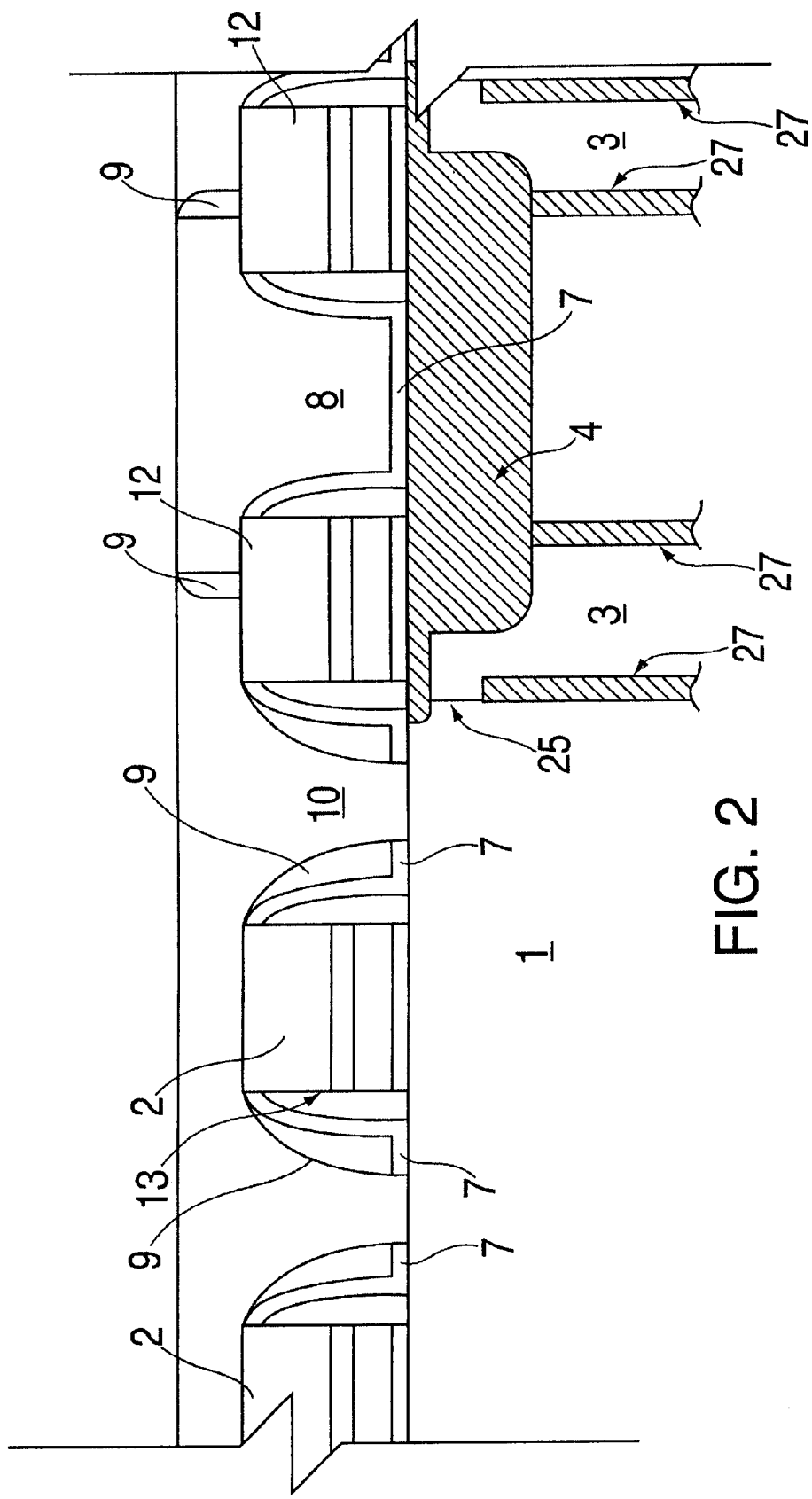

Referring to FIG. 2, a mask pattern, the same as the active area (AA) pattern, is applied and an etch is performed to remove the first insulative layer 8 (from the structure shown in FIG. 1) away from selective areas between the gates 2, while leaving the insulator 8 intact between passing wordlines 12. It is to be noted that since the area etched out is larger than in conventional processes, the borderless contact etch is easier in the present process than in previous conventional processes. In addition, it only is necessary to etch the BPSG insulator 8 approximately to the level of the gate conductor stack. It is to be noted that the support regions that require raised source-drain devices also have active regions (or portions thereof) opened at this step.

A second spacer layer 9, typically an oxide such as tetraethyl orthosilicate (TEOS), is applied to a thickness generally ranging from about 100 to about 400 angstroms, preferably about 150 to about 350 anstroms, and then RIEd to form spacers 9. The application of these spacers 9 has the effect of reducing bitline capacitance. The second spacer layer 9 also serves to fill in voids in the first insulative layer 8, where it comes into contact with that layer and thereby reduces bitline-to-bitline leakage. The requirements for first insulative layer 8 reflow conditions and void-free dielectric deposition may be substantially reduced. The aspect ratio for the second spacer 9 fill also may be reduced. It should be noted that spacers 9 are not formed between the passing wordlines 12 (see FIG. 2). Note further that the BPSG insulator 8 is etched selective to the barrier nitride layer 7. The TEOS spacer layer 9 then is formed and then the barrier nitride layer 7 is etched. Thus, the barrier nitride 7 also is not etched between the passing wordlines 12.

A polysilicon layer 10 then is deposited covering gates 2 and the spacers therebetween. This deposition of polysilicon 10 generally will have a thickness of about 1000 angstroms. The deposited polysilicon 10 then is planarized, using standard techniques such as chemical mechanical planarization (CMP). Support active regions that require raised source drain junctions wider than 200 nm will drive a thicker polysilicon deposition to completely fill these regions.

Figure 3:
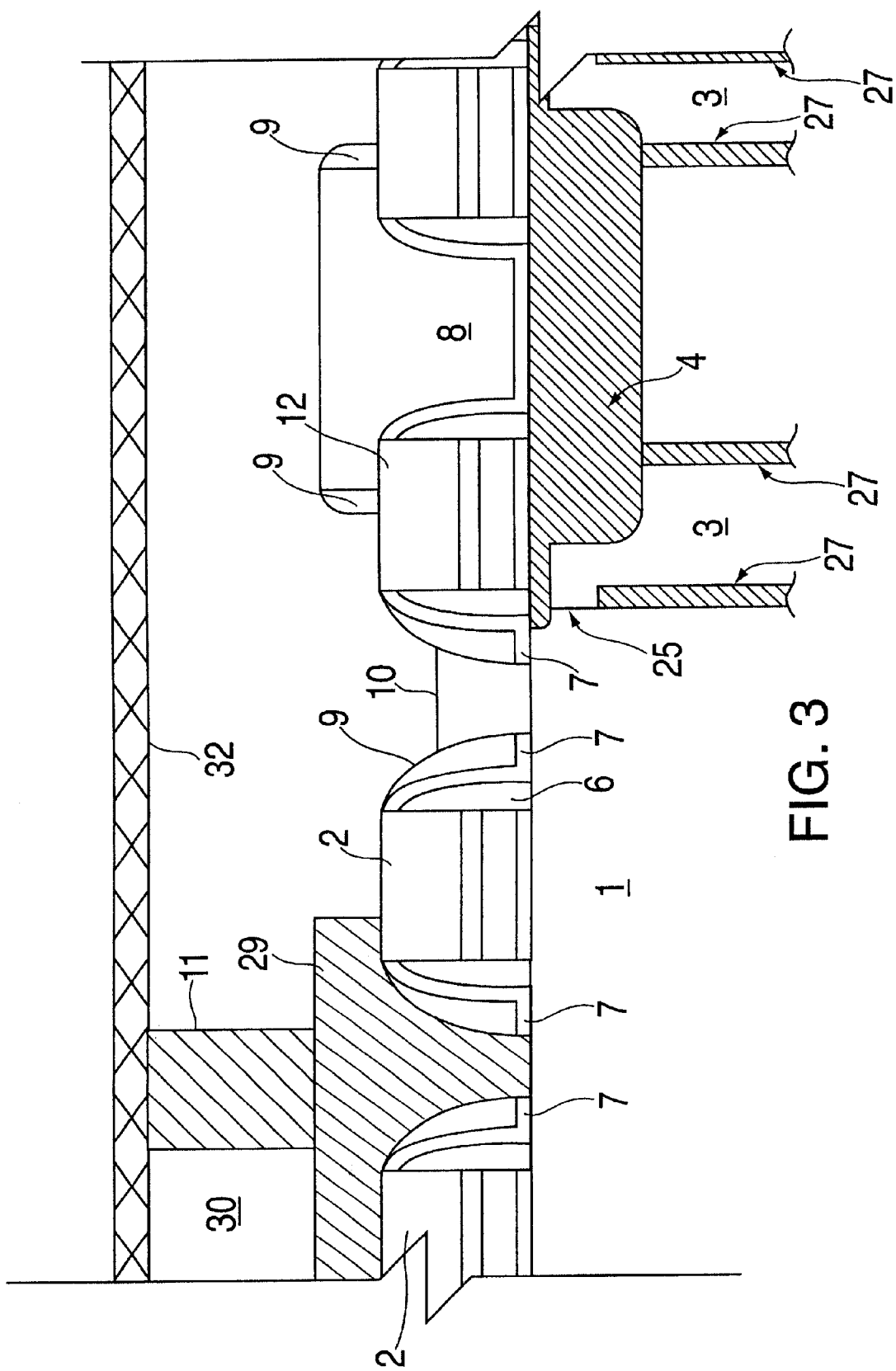

Referring now to FIG. 3, a photoresist "landing pad" mask is used to define and etch the landing pad areas 29 (see FIG. 4) over gates 2 where polysilicon studs 11 are to be formed. In the array, the landing pads 29 are formed on the bitline 32 side. The polysilicon layer 10 is recessed below the level of the gates 2 everywhere these contacts are not to be formed.

In the areas other than the array (core and peripheral regions), the landing pads are formed wherever contacts are to be formed. This allows for borderless contacts outside of the DRAM array. The array and regions of the supports where NFETs are to be formed have landing pads implanted with the Phosphorus (P), Arsenic (AS), Antimony (Sb), or some combination thereof. This results in the support NFETs having raised source and drain junctions.

Phosphorus used to dope polysilicon studs 11 will diffuse outward during thermal annealing and thereby form graded junctions. Graded junctions reduce junction leakage and ensure good electrical contact with buried straps 25. Channel-to-strap resistance is reduced by low resistive polysilicon studs.

The PFET regions in the non-array part have the landing pads implanted with Boron (B), $BF_2$, or some combination thereof.

Finally, after formation of the polysilicon studs 11, the studs and remaining exposed areas are covered with a second insulative layer 30, typically a non-conductive oxide such as TEOS or BPSG.

Figure 4:
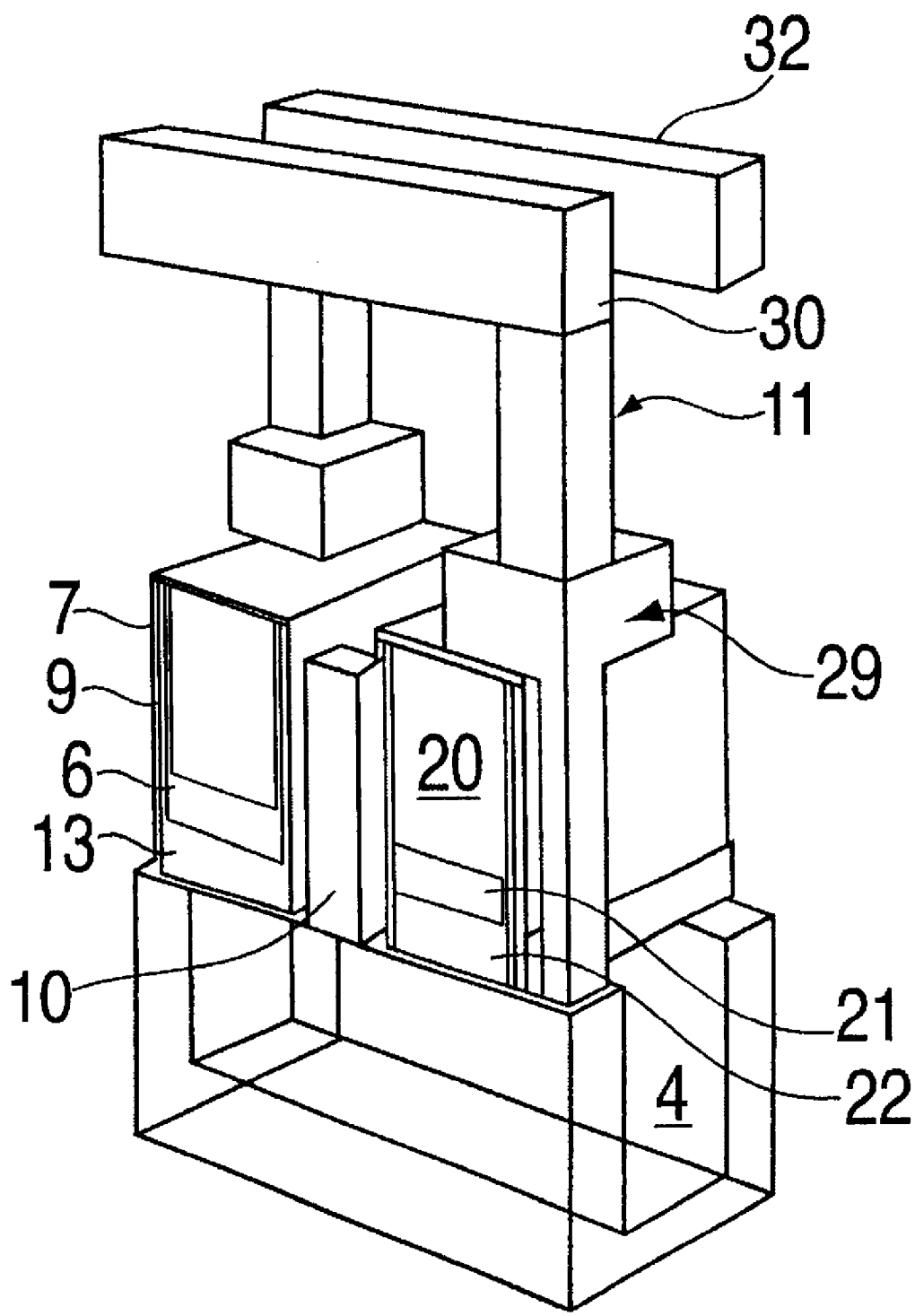
FIG. 4 is a schematic of the completed structure of the present invention.

In FIG. 4, a schematic of the structure of the present invention is depicted, with interlevel dielectrics cut-away.

Table A below reports the improvement in bitline capacitance achieved by the present invention, as compared to standard processing techniques:

TABLE A

| CAPACITANCE COMPONENT | POR* | NEW STRUCTURE[Δ] | |
|---|---|---|---|
| | | $T_{GC-80\,nm}$ | $T_{GC-55\,nm}$ |
| BL-BL (aF/bit) | 87 | 88 | 88 |
| BL-GC of AWL (aF/bit) | 84 | 53 | 48 |
| BL-MI of AWL (aF/bit) | 7 | 7 | 7 |
| BL-GC of PWL (aF/bit) | 7 | 2 | 3 |
| BL-MI of PWL(aF/bit) | 7 | 7 | 7 |
| TOTAL BL CAPACITANCE (aF/bit) (excluding diff'n-GC & diff'n P-WELL) | 192 | 157 | 153 |

* STANDARD PROCESS - THE BITLINE INCLUDES MO + CB STUD
[Δ]THE BITLINE INCLUDES MO + CB STUD + LANDING PAD + CS STUD, FOR THE NEW STRUCTURE
NET:
1. NEW STRUCTURE REDUCES WIRING COMPONENT (exclusive of diffusion) OF BL CAPACITANCE BY 19–20%.
2. REDUCTION IN TOTAL BL CAPACITANCE IS DUE TO VERY SIGNIFICANT REDUCTION IN BL-AWL CAPACITANCE –37–43%

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about, or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

We claim:

1. A method for forming a memory device having low bitline capacitance, comprising:

providing a gate conductor stack structure on a silicon substrate, said gate stack structure having a gate oxide layer, a polysilicon layer, a silicide layer, and a top dielectric nitride layer;

oxidizing sidewalls of said gate oxide stack;

forming first sidewall spacers on the sidewalls of said gate conductor stack, said first sidewall spacers comprising a thin layer of nitride having a thickness ranging from about 50 to about 250 angstroms;

overlaying the gate structure with a thin nitride liner having a thickness ranging from about 25 to about 150 angstroms;

depositing an insulative oxide layer over the gate structure;

polishing the insulative oxide layer down to the level of the nitride liner of the gate structure;

depositing a second insulative oxide layer;

patterning and etching the insulative oxide layer to expose said nitride liner;

forming second sidewall spacers over said first sidewall spacers, said second sidewall spacers comprising an oxide layer having a thickness ranging from about 100 to about 400 angstroms; and, depositing and planarizing a layer of polysilicon covering said gate structure and the sidewall spacers.

2. The method of claim 1 wherein the sidewall spacers comprise silicon nitride.

3. The method of claim 1 wherein the nitride liner comprises silicon nitride.

4. The method of claim 1 wherein said insulative oxide comprises BPSG.

5. The method of claim 1 wherein said first sidewall spacers have a thickness ranging from about 75 to about 150 angstroms.

6. The method of claim 1 wherein said nitride liner has a thickness ranging from about 50 to about 100 angstroms.

7. The method of claim 1 wherein said second sidewall spacers comprise TEOS.

8. The method of claim 7 wherein said second sidewall spacers comprise TEOS having a thickness ranging from about 150 to about 350 angstroms.

9. The method of claim 1 including patterning and etching a landing pad area over said gate structure where a contact is to be formed.

10. A method for forming a memory device having low bitline capacitance, comprising:

providing a gate conductor stack structure on a silicon substrate, said gate stack structure having a gate oxide layer, a polysilicon layer, a silicide layer, and a top dielectric nitride layer;

oxidizing sidewalls of said gate oxide stack;

forming silicon nitride sidewall spacers on the sidewalls of said gate conductor stack, said sidewall spacers comprising a thin layer of nitride having a thickness ranging from about 50 to about 250 angstroms;

overlaying the gate structure with a thin silicon nitride liner having a thickness ranging from about 25 to about 150 angstroms;

depositing a boron phosphorus silicate glass insulative oxide layer over the gate structure;

polishing the insulative oxide layer down to the level of the nitride liner of the gate structure;

depositing a second boron phosphorus silicate glass layer;

patterning and etching the insulative oxide layer to expose said nitride liner;

forming second sidewall spacers over said first sidewall spacers, said second sidewall spacers comprising a TEOS oxide layer having a thickness ranging from about 150 to about 350 angstroms;

depositing and planarizing a layer of polysilicon covering said gate structure and the sidewall spacers; and, patterning and etching a landing pad area over said gate structures where a contact is to be formed.

* * * * *